(12) United States Patent
Schiepp et al.

(10) Patent No.: US 10,424,717 B2
(45) Date of Patent: Sep. 24, 2019

(54) ACTUATOR DEVICE HAVING A MAGNETIC SHAPE-MEMORY ELEMENT

(71) Applicant: ETO MAGNETIC GMBH, Stockach (DE)

(72) Inventors: Thomas Schiepp, Seitingen-Oberflacht (DE); Markus Laufenberg, Stockach (DE)

(73) Assignee: ETO MAGNETIC GMBH, Stockach (DE)

( * ) Notice: Subject to any disclaimer, the term of this patent is extended or adjusted under 35 U.S.C. 154(b) by 780 days.

(21) Appl. No.: 15/022,473

(22) PCT Filed: Jul. 18, 2014

(86) PCT No.: PCT/EP2014/065565
§ 371 (c)(1),
(2) Date: Mar. 16, 2016

(87) PCT Pub. No.: WO2015/039784
PCT Pub. Date: Mar. 26, 2015

(65) Prior Publication Data
US 2016/0233408 A1    Aug. 11, 2016

(30) Foreign Application Priority Data
Sep. 17, 2013  (DE) .......................... 10 2013 110 253

(51) Int. Cl.
*H01L 41/06*    (2006.01)
*H01L 41/12*    (2006.01)

(52) U.S. Cl.
CPC .............. *H01L 41/06* (2013.01); *H01L 41/12* (2013.01)

(58) Field of Classification Search
CPC ................................ H01L 41/06; H01L 41/12
USPC .................................................. 335/220–229
See application file for complete search history.

(56) References Cited

U.S. PATENT DOCUMENTS

| 5,491,559 A * | 2/1996 | Buechler .................. B06B 1/08 310/26 |
| 7,246,489 B2 * | 7/2007 | Du Plessis .......... F16K 31/0613 251/129.06 |

(Continued)

FOREIGN PATENT DOCUMENTS

| CN | 102265032 A | 11/2011 |
| CN | 103174862 A | 6/2013 |

(Continued)

OTHER PUBLICATIONS

International Search Report for PCT/EP2014/065565 dated Oct. 16, 2014.

(Continued)

*Primary Examiner* — Bernard Rojas
(74) *Attorney, Agent, or Firm* — Bachman & LaPointe, PC

(57) ABSTRACT

An actuator device having an expansion unit, which has a magnetic shape memory alloy material (MSM), is configured to interact with a preferably non-magnetic ram unit and executes an expansion movement in an actuating direction as a reaction to an introduced magnetic flow, the expansion unit being oriented towards the ram unit along a longitudinal axis defined by the expansion direction, and being intended to exert an actuating force on said ram unit, wherein the ram unit is guided on the casing side in an associated housing section of the actuator unit, wherein an end section of the expansion unit and/or end section of the ram unit, the end section being realized in a transition region between the expansion unit and the ram unit, is configured such that, at least during the exertion of the actuating force along the longitudinal axis, an overlap that effects a form- and/or force-fit transversely to the longitudinal axis arises in the transition region.

8 Claims, 2 Drawing Sheets

(56) References Cited

U.S. PATENT DOCUMENTS

| | | | |
|---|---|---|---|
| 7,423,505 B2* | 9/2008 | Ohta | H02K 99/20 335/220 |
| 8,237,525 B2 | 8/2012 | Hoang et al. | |
| 8,707,694 B2 | 4/2014 | Olson et al. | |
| 9,847,160 B2* | 12/2017 | Schiepp | H01L 41/12 |
| 2005/0156367 A1* | 7/2005 | Knowles | B29C 47/0004 267/140.4 |
| 2009/0033448 A1 | 2/2009 | Hoang et al. | |
| 2011/0242398 A1 | 10/2011 | Honda et al. | |
| 2013/0038414 A1 | 2/2013 | Laufenberg et al. | |
| 2016/0148736 A1* | 5/2016 | Schiepp | H01L 41/12 335/268 |

FOREIGN PATENT DOCUMENTS

| | | |
|---|---|---|
| DE | 102004060532 A1 | 6/2006 |
| DE | 102011052528 B3 | 2/2013 |
| EP | 1760796 B1 | 12/2008 |
| JP | 05130786 A | 5/1993 |
| JP | 10503727 A | 4/1998 |
| JP | 10145892 A | 5/1998 |
| JP | 2001280215 A | 10/2001 |
| JP | 2005094448 A | 4/2005 |
| JP | 2005253123 A | 9/2005 |
| JP | 2006165483 A | 6/2006 |
| JP | 2006186659 A | 7/2006 |
| WO | 9614209 A1 | 5/1996 |

OTHER PUBLICATIONS

Japanese office action for patent application No. 2016-543338 dated Feb. 27, 2018.

Chinese Office action for Chinese patent application No. 201480051227.7 dated May 5, 2017.

* cited by examiner

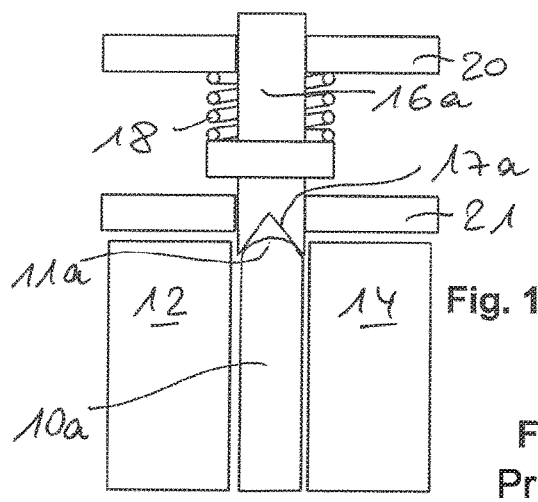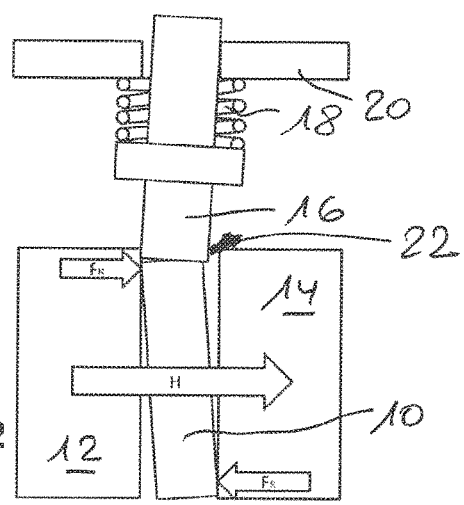
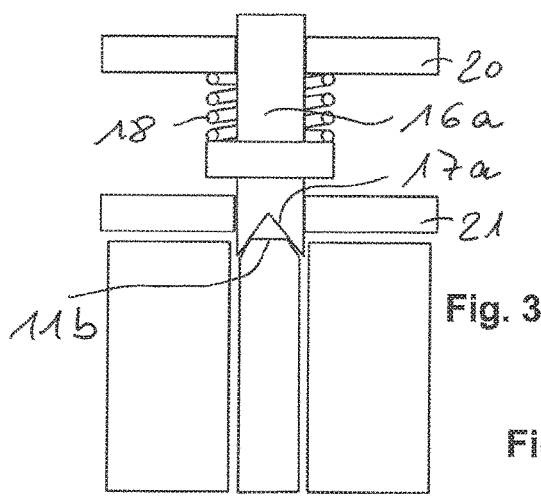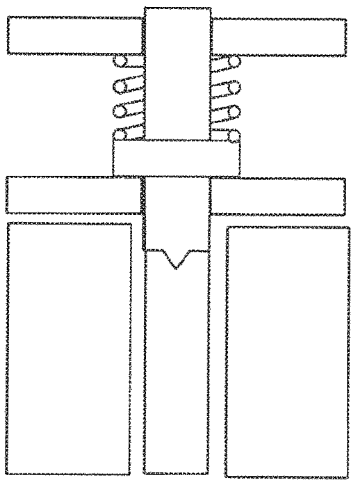
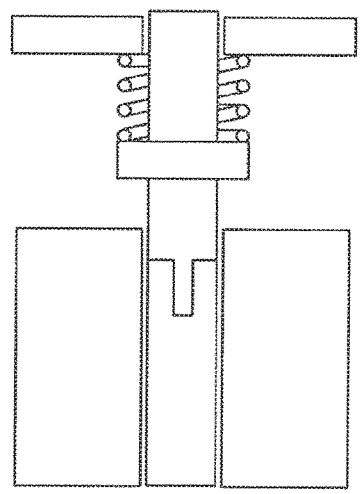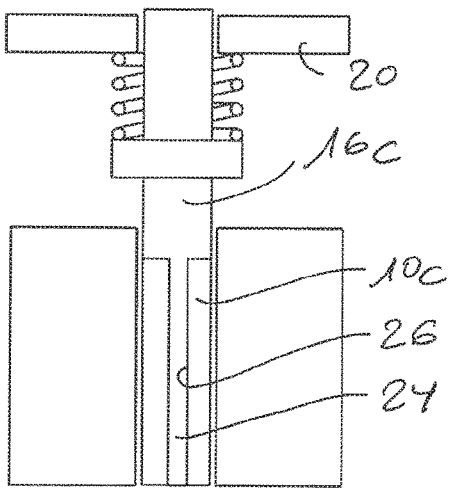

ACTUATOR DEVICE HAVING A MAGNETIC SHAPE-MEMORY ELEMENT

BACKGROUND OF THE INVENTION

The present invention relates to an actuator device.

Such a device is known for example from EP 1 760 796 B1 and describes the use of an expansion element of a magnetic shape memory alloy material (MSM=magnetic shape memory, used here below synonymously with the German abbreviation magnetic FGL=Formgedächtnislegierung [shape memory alloy]) for the desired actuator- or respectively actuating device. In practical terms, for effecting this drive, an MSM(FGL) crystal body, typically produced on the basis of an NiMnGa alloy, is acted upon by a magnetic field generated by an energized coil. As a reaction to such a magnetic flow (typically introduced on the casing side), the MSM crystal body carries out, as expansion unit, an expansion movement, the stroke of which usually runs in a direction perpendicularly to the magnetomotive force direction with the magnetic flow. This expansion movement then acts on a ram adjoining on the end side along the expansion- or respectively actuating direction, which in turn, corresponding to a respective actuating task, interacts with a suitable actuating partner.

Generally, actuators based on MSM have the advantage of quick switching times and high switching cycles (so-called switching operation number, which can comprise more than 400 million expansion processes). MSM expansion units used for actuating elements and expandable as a reaction to the introduced magnetic flow enable a typical expansion stroke in the order of approximately 4% to 6% in relation to the actuating- or respectively expansion direction (in the non-expanded state), wherein the crystal body usually elongated in this direction is supported on its face side lying opposite the ram unit or respectively is fixed there and receives on the casing side the magnetic flow introduced by flow conducting means.

FIG. 2 for the diagrammatically illustrated prior art, presupposed as being known, illustrates a problem resulting from this operating principle: An MSM crystal body 10 as expansion unit, supported on the base side in a suitable manner, is acted upon via a pair of flow conducting bodies 12, 14 engaging on the casing side with a magnetic flow H (running in the plane of the figure transversely and thereby perpendicularly to the longitudinal axis) for expansion. As in practice a completely homogeneous magnetic flow input into the expansion body 12 is only rarely possible, and the latter, in order to enable an efficient expansion, must be guided with clearance within the flow conducting structure 12, 14, an oblique position or respectively a tilting of the expansion crystal 10 occurs, as shown diagrammatically in FIG. 2. The consequence are disadvantageous frictional forces $F_R$ at the contact surfaces, occurring through the oblique position, to the flow conducting elements 12, 14, with the result that friction influences the dynamic characteristics and the efficiency of the actuator device subsequently and in addition wear- or respectively so-called tribocorrosion occurs especially at the ends of the expansion body. Even (local) deformation effects on the MSM element are possible, with the disadvantageous consequence that the operational behaviour or respectively the lifespan of the device is impaired.

Additionally disadvantageously, the end face, directed on the engagement side (i.e. onto an interacting ram unit 16, which is guided, shown diagrammatically, against the force of a return spring 18 in an actuator housing 20) in the transition region 22 to the ram 16 engages eccentrically and thereby in a punctiform manner onto the ram, creates potentially harmful friction here and leads, in addition, to a (typically oppositely directed) tilting of the ram unit 16 within its guide (i.e. associated with the ram). With a play which is also necessarily present here, therefore the disadvantageous tilting of the expansion unit from the ideal actuating direction has a disadvantageous effect on the downstream ram unit.

A further disadvantageous effect of the oblique position, shown in FIG. 2, occurring on introduction of the magnetic flow H is the fact that the magnetic field (with assumed flow lines running in an ideal parallel manner) no longer meets perpendicularly onto the corresponding, associated lateral face of the MSM expansion unit 10, the crystalline main axes of which, however, are directed parallel to the edges or respectively lateral faces. Accordingly, an angular deviation of the magnetic field from the (ideal) normal occurs, which as a result leads to an increase of the current required for the magnetic flow, in order to bring about an actuator movement (switching) of the actuator. The effect that the shown oblique position favours an oblique field line course (namely in the plane of the figure of FIG. 2 from top left to bottom right) and thereby a field component in oblique direction, also has a disadvantageous and current-increasing effect, because the magnetic resistance at the friction- or respectively contact sites is lowered and thus the air gap between expansion unit and surrounding flow-conducting structure is bridged.

In the technical teaching described in EP 1 760 796 B1 the MSM expansion unit is guided in a lateral guide (typically realized by means of a groove), wherein the groove lies in a neutral, geometrically non-altering plane. This technical measure in fact prevents or makes difficult the previously described disadvantageous tilting, but is itself again disadvantageous: In fact, in the case of optimum dimensioning and the best possible tolerance configuration, the MSM unit is held in its position defined by the groove, but friction between the expansion unit and the flow-conducting means interacting therewith is not prevented, rather this friction is displaced to the groove region of the MSM expansion unit. Therefore, it is to be expected that wear occurs here, which in turn, directly critically in this relatively delicate mechanical configuration, significantly shortens the lifespan. The technology described in EP 1 760 796 B1 is also tolerance-susceptible, because for preventing tilting or suchlike blocking behaviour the shape and position of the grooves (in interaction with the outer guide partners) must be manufactured precisely.

Finally, this known technical teaching is disadvantageous with regard to the effect that, depending on the microstructure of the MSM body realizing the expansion unit, during the switching process a bend of approximately 3° runs through the element; already this effect makes a geometrically fixed "neutral" mounting according to EP 1 760 796 B1 impracticable.

It is therefore an object of the present invention to improve a generic actuator device with regard to its expansion- and efficiency behaviour, in particular to prevent or reduce a friction, effected during the expansion movement of the expansion unit, on associated lateral flow-conducting means and/or on the ram unit, to prevent or reduce corresponding wear and to thus create a device which combines improved dynamics- and actuating characteristics with increased lifespan, reduced current consumption and increased switching operation numbers.

SUMMARY OF THE INVENTION

The problem is solved by the actuator device of the invention described hereinbelow. Protection within the scope of the present invention is further intended for an MSM expansion unit for use in the actuator devices according to the invention, in particular when it is the result of a manufacturing method which after the steps of crystal production, crystal division (and if applicable the upstream crystal measurement for identification of the expansion axis/axes) provides the formation of a profiled face side or end face, as enabled by the functionality according to the invention, and occurs during production by electropolishing and/or extraction from an electrolyte bath.

In an advantageous manner according to the invention, the transition region between the expansion unit and the ram unit is formed by suitably profiled configuration of the respective and sections so that along the longitudinal axis into the transition region an overlap arises, effecting a form- and/or force fit (transversely to the longitudinal axis); in this way, at least during the engagement between the units, i.e. during the exerting of the actuating force through the expansion unit onto the ram unit, a righting moment can be transferred through the ram unit onto the MSM expansion unit, with the effect that despite the introduced magnetic flow into the MSM crystal, the latter remains in or close to its ideal movement direction and accordingly the harmful frictional-, magnetic field concentration- and wear effects, resulting from the undesired inclination, can be effectively prevented. Rather, the connection between the units, existing at least in this engagement state, acting transversely to the longitudinal axis of movement, makes provision that the guide (or respectively lateral support) of the ram unit, which according to a further development and preferably is realised within the scope of the invention at several sites or respectively continuously along its longitudinal extent on or respectively in the associated housing section, is transferred to the MSM expansion unit and prevents the latter from tilting.

It is therefore within the scope of the invention here, on the one hand, to configure this advantageous form fit and/or force (acting in the transverse direction), both only temporarily, i.e. to provide this in the case of units detached or respectively detachable from one another only for the state in which the ram unit is driven through expansion of the expansion unit. On the other hand, provision is made according to a further development and is included by the invention, to provide a non-detachable connection between the expansion unit and the ram unit, so that the guide according to the invention, preventing a deflecting or respectively tilting of the ram unit, in the associated housing section is transferred permanently to the expansion unit and fixes the latter along the (ideal) longitudinal axis, therefore effectively prevents the disadvantageous tilting.

The profiling according to the invention, which permits the form- or respectively force fit according to the invention, can be realized in various ways. Thus, on the one hand, it is advantageous and included by further developments of the invention, to configure the end section of the expansion unit, directed to the ram unit, in the transition region so as to be wedge-shaped or conical, alternatively to form it in a curved manner so as to be concave, in the manner of a low dome or calotte, wherein then advantageously the respectively opposite, interacting end section of the ram unit has an inner cone, a funnel- or calotte shape enabling at least the transversely running force fit. This transition therefore does not have to be form-fitting in every case, in particular can also be configured still receiving play or can enable tilt angles (in a distinctly reduced manner).

In particular with regard to an advantageous form fit in the transition region between the units, provision is made in other preferred embodiments of the invention to provide a groove/tongue realization, again alternatively to associate with one of the partners on the end side a cone-shaped, cone-section-shaped or cylindrical projection, which is then received in a respectively suitable mount of the counterpartner. In this way, the form fit which is able to be achieved then provides for a particularly stable transition and thereby for a particularly effective transmission of the guiding force preventing the tilting inclination of the expansion unit through the ram unit. In a particularly favourable manner in terms of production and with configuration of the projection as a (preferably centric) cylinder, it is again preferred to provide the associated mount as a bore or suchlike (further preferably continuous) opening, wherein for reasons of simpler producibility, this is carried out preferably in the expansion unit, but the inventive further development is not restricted to this variant.

It lies within the scope of further preferred further developments of the invention to carry out the transition region between expansion- and ram unit not directly, but with intercalation or respectively parallel connection of a connecting element provided according to a further development. This would preferably be provided on one of the partners, further preferably in a non-detachable manner, and then, for the purpose of the transmission of the righting force according to the invention, would offer a suitable receiving section, further preferably configured as a sleeve or respectively sleeve segment.

Such a further development of the invention advantageously permits the manufacture of the ram- or respectively expansion unit to be configured more simply, in particular to prevent a processing of the (potentially brittle and mechanically difficult to handle) engagement end of the expansion unit in the transition region in that the latter (in ideal cylindrical or respectively cuboid-shaped contour) engages into the receiving section, offered by the connecting element, for the production of the transition according to the invention.

In order to adapt or respectively optimize the magnetic flow conditions in the transition region, in particular with the use of such a connecting element, provision is again made within the scope of advantageous further developments of the invention to adapt (e.g. form) a longitudinal section contour of adjacent flow conducting sections in a suitable manner, additionally or alternatively the magnetic flow input could take place by means of the flow conducting sections into the MSM expansion unit, with the omission of this connecting element (or respectively this, again alternatively, could be constructed in a suitably magnetically flow-conducting manner).

The invention variant of configuring the transition region between the expansion unit and the ram unit securely (in particular secure with respect to tilting) and non-detachably, provides basically any desired connection techniques, wherein gluing, soldering or welding (fusing) of these units are preferred variants. Here, it is included by the invention on the one hand in the further development of the inventive idea of the profiled configuration of the transition region to connect these (correspondingly profiled) ends of the units non-detachably with one another. Alternatively (and claimed independently within the scope of the invention), provision is nevertheless also made to connect suitably parallel or respectively planar end faces or expansion- or respectively ram unit, which without non-detachable connection could firstly not transfer any transverse force in the transition, in this manner according to a further development non-detachably and thereby to achieve the advantages according to the invention.

Again, independent protection within the scope of the invention, nevertheless also as a possible further development of the preceding claims, is provided to associate with the expansion unit supporting- and/or righting means on the casing side or respectively (lying opposite the ram unit) on the end side. These supporting- or respectively righting means, for instance profilings provided in an end-supporting region to an actuator housing on the base side and interacting in a suitable manner with the ram unit, then bring about at least in the expansion- and force-application operation onto the ram unit a righting of the expansion unit into the ideal, tilt-free longitudinal axis. A comparable effect is achieved by the supporting- or respectively righting means on the casing side, able to be provided additionally or alternatively, which, suitably as buffer-, flexing- or spring means, engage on the casing side and support the expansion unit in the direction of the ideal longitudinal axis (wherein both metallic or polymeric) spring means, and also other elastomer bodies, also engaging in a punctiform manner, can realize this advantageous effect, so that also for instance foams or suchlike are to be included in these advantageous instruments according to a further development. Again advantageously in a further development, provision is made that these buffer-, flexing- and spring means, in any desired configurations, are realized in a magnetically conducting manner, which facilitates and optimizes the flow input on the casing side into the MSM expansion unit (because indeed in this respect the expansion unit would then be to be supported on the casing side against the flow-conducting means and too great an air gap here would impair the flow input and thereby the efficiency of the device as a whole in a disadvantageous manner).

As a result, through the present invention, in a surprisingly simple, elegant and favourable manner with regard to manufacturing technique, the practically significant problem is solved of keeping an MSM unit, held (necessarily involving play) in a lateral or respectively casing-side flow-conducting arrangement, from tilting out of its expansion- and longitudinal direction, by namely in various ways the guide provided by the ram unit as partner being transferred to the expansion unit at the transition region and in this way the desired stabilizing being enabled in a simple manner and with little effort. Measures engaging in a suitable manner on the on the casing side or oppositely on the face side, are advantageous variants or respectively alternative forms of realization, which can then be selected in a suitable manner according to the purpose of use.

BRIEF DESCRIPTION OF THE DRAWINGS

Further advantages, features and details of the invention will emerge from the following description of preferred example embodiments and with the aid of the drawings; these show in FIG. 1: a schematic diagram in longitudinal section of a first embodiment of the present invention;

FIG. 2: an illustration in perspective analogous to FIG. 1 to illustrate the initial position of the prior art and the disadvantages connected therewith;

FIG. 3: a variant of FIG. 1 as second example embodiment;

FIG. 4: a variant of FIG. 2 as third example embodiment;

FIG. 5, 6: variants of the previously described example embodiments as fourth example embodiment;

DETAILED DESCRIPTION

Figure 7:
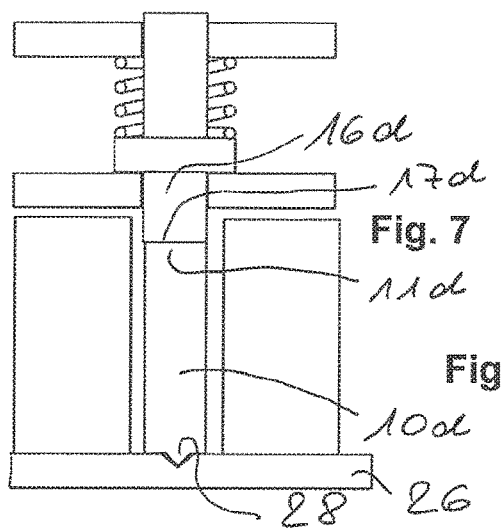
FIG. 7: a fifth example embodiment of the present invention.

In all the example embodiments to be described below, the same reference numbers denote identical or functionally equivalent function components, so that even in the case of individual components not described in detail for each example embodiment, this is to be understood as having the same effect or respectively analogous to previously described example embodiments or respectively the prior art. Also, for simplification in the illustration of the invention variants, a uniform, identical longitudinal section illustration was selected; the specialist will understand that here respectively any desired, also not radially symmetrical variants are conceivable.

FIG. 1—with regard to equivalent reference numbers, in this respect reference is to be made to the introductory description concerning the selected prior art according to FIG. 2—illustrates firstly how, through respective end sections of the MSM expansion unit 10 configured in a profiled manner in the transition region 22, or respectively of the ram unit 16, the force fit according to the invention, acting transversely to the longitudinal/extent direction, arises: The expansion unit 10*a* shown in FIG. 1 (again supported on the base side, i.e. downwards in the plane of the figure) forms in the transition region 22 to the ram unit 16*a* a calotte shape or respectively an end region 11*a*, curved in longitudinal section, which in the manner shown engages into an end section 17*a*, in the shape of a hollow cone, of the ram unit 16*a*. In addition, FIG. 1 shows that the ram unit 16*a* is not supported, as in the prior art, only at one end or respectively on the end side (there in FIG. 2 at the housing 20), but rather, axially adjacent to the flow-conducting sections 10, 12, has a second support 21 in the form of a (fixed) housing strut or suchlike with an opening guiding the engagement end 17 of the ram unit 16*a*.

It becomes immediately evident that in the expansion operation of the expansion unit 10*a* of FIG. 1, an effective transfer of the lateral guide of the ram unit 16*a* to the ram unit 10*a* can occur, consequently this no longer shows the negative tilting discussed in FIG. 2 regarding the prior art, or respectively will only show this in a distinctly lesser manner.

The example embodiment of FIG. 3 shows as a variant to FIG. 1 an alternative configuration of the engagement region on the MSM expansion body. This expansion unit 10*b* in FIG. 3 now has a section 11*b* in the shape of a truncated cone, which, with improved form fit, can engage into the hollow cone 17*a* at the end of the ram unit 16*a* on the engagement side. Again, the example embodiment of FIG. 3 advantageously realizes the transfer of a righting- or respectively transverse guidance moment to the expansion unit 10*b*.

The example embodiments of FIGS. 4 to 6 show further variants, here for the realization of a form fit between ram unit and MSM expansion unit in the transition region. Thus, FIG. 4 illustrates either a transversely running groove/tongue combination with an acute inlet (FIG. 5, on the other hand, a corresponding groove/tongue configuration with a cross-sectionally rectangular course); alternatively and again in radially symmetrical observation, the variants of FIG. 4 or respectively 5 would also display conical (FIG. 4) or respectively cylindrical (FIG. 5) projections, which engage axially centrally into respectively associated, compatibly configured recesses (centrally hollow-conical in FIG. 4, hollow-cylindrical in FIG. 5). FIG. 6 discloses again a variant, in which in the transition region between the MSM expansion body 10c and the ram unit 16c the form fit and (transversely acting) force fit is realized by an engagement ram appendage, reduced in diameter with respect to the upper ram, as elongated projection 24 on the ram, which engages into a centric bore 26 as an opening in the MSM crystal body and thus enables a connection which is simple to produce, nevertheless able to be highly stressed (and in addition flexible within limits).

All the above-mentioned example embodiments have in common the fact that they can also be inverted with regard to the respectively shown profilings, i.e. for instance the projections shown in connection with the ram configuration on the engagement side could likewise be realized as projections on the MSM crystal side and can then engage into correspondingly negative shapings in or respectively out of the ram unit.

FIG. 7 shows as an example embodiment of the invention a variant in which a ram unit 16d with a transverse face 17d running in a planar manner sits securely and non-detachably on a correspondingly planar and parallel-running end face 11d of the associated MSM expansion unit 10d. This is, in addition, supported in a profiled manner on the base side (i.e. with regard to a housing section 26 on the base side) by means of a profile transition 28, which in the example embodiment shown achieves an alignment (brought about at least on expansion or respectively force load in axial longitudinal direction) to the longitudinal axis; depending on the configuration of the transition to the base section 28 (which can basically also be unprofiled, i.e. respectively planar), it is in addition alternatively possible to configure the transition region between the planar MSM crystal section 11d and the ram section 17d without a fixed connection, thereby to provide these units interacting detachably on one another or respectively with one another.

Figure 8:
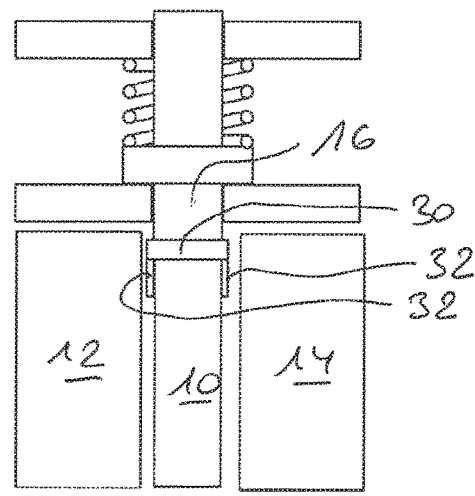
FIG. 8: a sixth embodiment of the present invention.

The example embodiment of FIG. 8 illustrates a further example embodiment of the invention, wherein here the ram unit 16 or respectively the expansion unit 10 can remain in their unprofiled form and the advantageous effect according to the invention, preventing the tilting of the expansion unit, is realized by a connecting element 30 which in the example embodiment shown sits (e.g. by gluing) non-detachably on the face side on the ram unit and, illustrated in the longitudinal sectional view of FIG. 8 by a pair of longitudinal webs 32, offers a mount for the end of the MSM expansion unit 10 on the transition side. Alternatively, this element is realized as an assembly section of the ram unit 16, sitting in one piece thereon. In this way, advantageously in particular a machining or otherwise profile-producing treatment of the transition-side end section of the units (in particular of the expansion unit) can be avoided. According to a further development, it is in addition possible and advantageous to adapt the laterally constructed flow conducting sections 12, 14 in a suitable manner, for instance in that either these units do not extend in axial (extent) direction laterally over the assembly 32, alternatively in this region have suitable shapings in or respectively out (wherein for instance then also the connecting assembly 32 can be configured so as to be magnetically conducting in a suitable manner), so that in this respect along the entire input length into the MSM expansion unit a homogeneous magnetic flow input is made possible.

Figure 9:
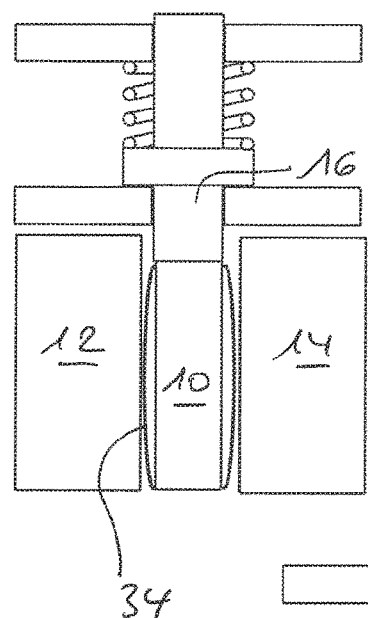
FIG. 9: a seventh embodiment of the present invention.
Figure 10:
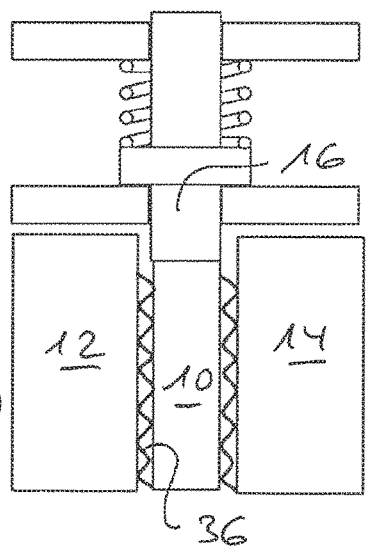
FIG. 10: an eighth embodiment of the present invention.
Figure 11:
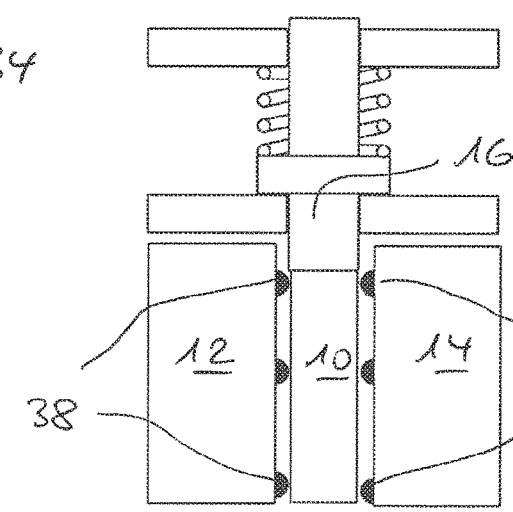
FIG. 11: a ninth embodiment of the present invention.

FIGS. 9 to 11 illustrate variants of the invention, in which through means engaging laterally onto the MSM expansion unit 10 these are supported and prevented from disadvantageous tilting (FIG. 2); these variants are equally possible as isolated forms of realization of the invention as advantageous further developments of the previously described invention variants or respectively example embodiments. Thus, FIG. 9 shows a spring 34 supporting the expansion unit to the flow conducting units 12, 14 on the casing side, which spring can be realized in a suitable manner for instance from spring steel or beryllium copper. A variant of the spring form of FIG. 9 is shown by the example embodiment of FIG. 10 with an alternative spring contour 36, configured so as to be cross-sectionally undulated. Again alternatively, the example embodiment of FIG. 11 illustrates elastomers 38, realized preferably in a magnetically conducting manner, which, distributed in a suitable manner along the extent length and in the circumference or respectively to the flow conducting assemblies 12, 14 lying opposite on the casing side, realize the supporting effect according to the invention (in all these example embodiments, basically a loose coupling of expansion unit 10 and ram unit 16 is made possible, just as the variant of fixed, non-detachable connection by gluing, welding or suchlike is conceivable). Again advantageous further developments (and not illustrated separately in the figures) make provision for instance that the elastomeric supporting elements (for instance 38 in FIG. 11) are configured so that these can receive a flexing movement (brought about through a local extension or suchlike shaped element of the MSM element). In addition, foam-like materials are conceivable (according to a further development again configured so as to be magnetically conducting in a suitable manner), which can receive local relative movement in a suitable buffered and/or flexing manner.

The present invention is not restricted to these embodiments of the invention, rather almost any desired ways present themselves to bring about according to a respective usage environment, a necessary geometry or suchlike, the supporting according to the invention or respectively the transfer of the transverse support of the ram unit to the expansion unit through force transmission at the transition region.

The invention claimed is:

1. An actuator device comprising:
   an expansion unit (10; 10a to 10d) which has a magnetic shape memory alloy material (MSM), is configured to interact with a non-magnetic ram unit (16; 16a to 16d) and executes an expansion movement in an actuating direction as a reaction to an introduced magnetic flow, which is directed perpendicular to the actuating direction;
   said expansion unit being oriented towards the ram unit along a longitudinal axis defined by the expansion direction, and being intended to exert an actuating force on said ram unit;
   wherein the ram unit is guided on a casing side in an associated housing section (21) of the actuator unit; and
   an end section (11a to 11d) of the expansion unit implemented in a transition region between the expansion unit and the ram unit and/or an end section (17a to 17d) of the ram unit, is configured such that, at least during exertion of the actuating force along the longitudinal axis, an overlap occurs in the transition region that effects a form- and/or force-fit transverse to the longitudinal axis so as to receive play.

2. The device according to claim 1, wherein the end section of the expansion unit is constructed tapered in a wedge- or cone-like manner or curved in a concave-, flat dome- or calotte-like manner and for interaction with the end section of the ram unit having an inner cone, the wedge-, funnel-, dome- or calotte shape.

3. The device according to claim 1, wherein the transition region has a connecting element (30) realizing the overlap, non-detachably secured at the end region of the expansion unit or of the ram unit, or connected in one piece with the expansion unit or with the ram unit, which offers a receiving section (32), at least partially surrounding the end region of the respectively other unit.

4. The device according to claim 3, wherein a flow conducting section provided for magnetic flow introduction into the expansion unit adjacent to the latter has in longitudinal section a shape adapted to a longitudinal section contour of the connecting element and/or of the receiving section, or is shortened axially by an axial extent of the connecting element or of the receiving section.

5. An actuator device comprising:
an expansion unit which has a magnetic shape memory alloy material (MSM), is configured to interact with a non-magnetic ram unit and executes an expansion movement in an actuating direction as a reaction to an introduced magnetic flow,
said expansion unit being oriented towards the ram unit along a longitudinal axis defined by the expansion direction, and being intended to exert an actuating force on said ram unit,
wherein the ram unit is guided on a casing side in an associated housing section of the actuator device,
wherein the expansion unit, held in an MSM housing section of the actuator device on the casing side and/or on a face side lying axially opposite a transition region to the ram unit, has supporting- and/or righting means (28; 34; 36) in an associated manner so that at least on exerting the actuating force through the expansion unit a righting moment is exerted on the expansion unit so as to bring the expansion unit into a tilt-free longitudinal axis, wherein the supporting- or respectively righting means have buffer-, flexing- and/or spring means engaging on the casing side onto the expansion unit and supporting the latter from a surrounding housing section.

6. The device according to claim 5, wherein the buffer-, flexing- or respectively spring means are constructed so as to be magnetically flow-conducting and enable the introduction of the magnetic flow from the surrounding housing section into the expansion unit.

7. The device according to claim 6, wherein the supporting- or respectively righting means have a preferably form-fittingly and/or correspondingly profiled housing profile section interacting with the face side, which is constructed in a profiled manner.

8. The device according to claim 7, wherein the ram unit is embodied so as to be magnetically conducting at least in sections and is guided through magnetic bearing means in the associated housing section.

* * * * *